United States Patent
Wada et al.

(10) Patent No.: US 9,419,616 B2
(45) Date of Patent: Aug. 16, 2016

(54) LVDS DRIVER

(71) Applicants: Yohichi Wada, Kyoto (JP); Tohru Kanno, Osaka (JP)

(72) Inventors: Yohichi Wada, Kyoto (JP); Tohru Kanno, Osaka (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days.

(21) Appl. No.: 14/542,731

(22) Filed: Nov. 17, 2014

(65) Prior Publication Data
US 2015/0155875 A1    Jun. 4, 2015

(30) Foreign Application Priority Data

Nov. 29, 2013   (JP) .................................. 2013-247241

(51) Int. Cl.
*H03K 19/0185*   (2006.01)
(52) U.S. Cl.
CPC ............................... *H03K 19/018514* (2013.01)
(58) Field of Classification Search
USPC ................. 327/108, 170, 171, 256, 258–259; 326/82, 87, 91
See application file for complete search history.

(56) References Cited

U.S. PATENT DOCUMENTS

| | | | | | |
|---|---|---|---|---|---|
| 5,986,489 | A | * | 11/1999 | Raza | H03K 19/00361 326/82 |
| 7,843,235 | B2 | * | 11/2010 | Yanbo | H03K 19/00361 326/83 |
| 8,665,681 | B2 | * | 3/2014 | Kitayama | G11B 7/00456 369/119 |
| 8,669,792 | B2 | * | 3/2014 | Rao | H04L 25/0274 326/83 |
| 2008/0170604 | A1 | | 7/2008 | Komoda | |

FOREIGN PATENT DOCUMENTS

| | | |
|---|---|---|
| JP | 2004-072344 | 3/2004 |
| JP | 2004-289354 | 10/2004 |
| JP | 2006-303915 | 11/2006 |
| JP | 2007-249942 | 9/2007 |
| JP | 2009-003863 | 1/2009 |
| JP | 2012-044489 | 3/2012 |

* cited by examiner

*Primary Examiner* — An Luu
(74) *Attorney, Agent, or Firm* — Cooper & Dunham LLP

(57) ABSTRACT

An LVDS driver includes a plurality of differential signal generators to receive adjustment signals generated by a slew rate adjusting unit and generate a differential signal for transmission to a plurality of LVDS receivers through a transmission line. The slew rate adjusting unit receives slew rate control signals from a slew rate control signal setting unit, and a slew rate of the differential signal is adjusted based on the adjustment signals.

5 Claims, 8 Drawing Sheets

LVDS DRIVER

CROSS-REFERENCE TO RELATED APPLICATION

This patent application is based on and claims priority pursuant to 35 U.S.C. §119(a) to Japanese Patent Application No. 2013-247241, filed on November 29, 2013, in the Japan Patent Office, the entire disclosure of which is hereby incorporated by reference herein.

BACKGROUND

1. Technical Field

Example embodiments of the present invention generally relate to a low voltage differential signal (LVDS) driver.

2. Background Art

In recent years, low voltage differential signal (LVDS) drivers are used for high-speed transmission interface with small-amplitude signals.

SUMMARY

Embodiments of the present invention described herein provide an LVDS driver that includes a plurality of differential signal generators configured to generate a differential signal to transmit the generated differential signal to a plurality of LVDS receivers through a transmission line, A slew rate of the differential signal is controlled for each output of the differential signal.

BRIEF DESCRIPTION OF THE DRAWINGS

A more complete appreciation of exemplary embodiments and the many attendant advantages thereof will be readily obtained as the same becomes better understood by reference to the following detailed description when considered in connection with the accompanying drawings.

Figure 1:
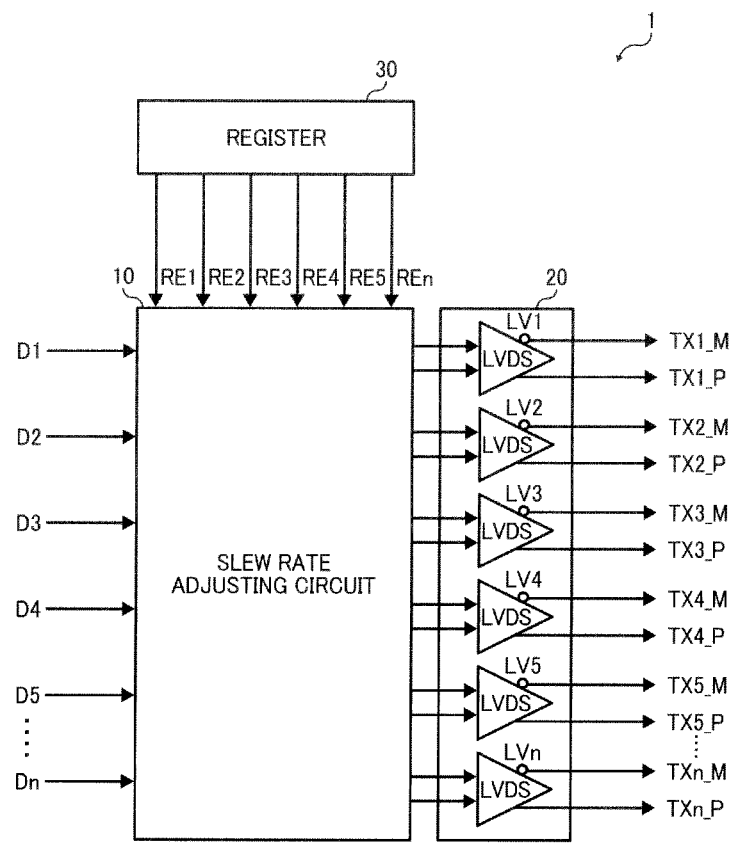
FIG. 1 is a block diagram illustrating an outline of the configuration of a LVDS driver according to a first example embodiment of the present invention.

The accompanying drawings are intended to depict exemplary embodiments of the present disclosure and should not be interpreted to limit the scope thereof. The accompanying drawings are not to be considered as drawn to scale unless explicitly noted.

DETAILED DESCRIPTION

The terminology used herein is for the purpose of describing particular embodiments only and is not intended to be limiting of the present invention. As used herein, the singular forms "a", "an" and "the" are intended to include the plural forms as well, unless the context clearly indicates otherwise, It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

In describing example embodiments shown in the drawings, specific terminology is employed for the sake of clarity. However, the present disclosure is not intended to be limited to the specific terminology so selected and it is to be understood that each specific element includes all technical equivalents that have the same structure, operate in a similar manner, and achieve a similar result.

Figure 8:
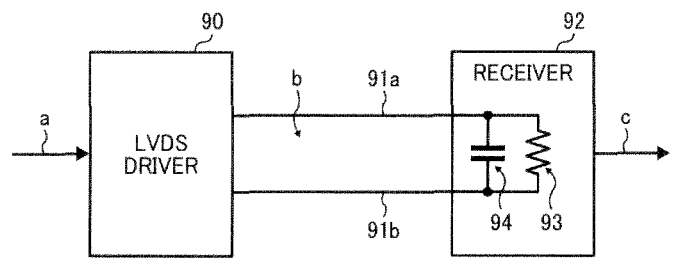
FIG. 8 illustrates the basic principles of the operation of a LVDS driver according to an example embodiment of the present invention.

The basic principles of the operation of such LVDS drivers are described with reference to FIG. 8.

Firstly, an input signal a having a plurality of pulse waveforms to be transmitted are input to a LVDS driver 90. The LVDS driver 90 modifies the input signal a such that the signal level fluctuates between a positive (+) side and a negative (−) side and the amplitude is reduced to, for example, equal to or less than 100 mV, to obtain a differential signal b. Then, the LVDS driver 90 transmits the differential signal b to a receiver 92 that serves as a LVDS receiver, through a pair of output signal lines 91a and 91b. The output signal lines 91a and 92b are terminated by a parallel circuit of a terminating resistor 93 and a capacitance 94 within the receiver 92. The receiver 92 detects the flowing direction of the differential signal b at the terminating resistor 93, and reproduces a signal corresponding to the input signal a based on the detected flowing direction. Then, the receiver 92 outputs the reproduced signal as a received signal c. In order to achieve high-speed signal transmission in a LVDS driver, it is necessary to maintain the quality of waveform to prevent malfunction. As a cause of deterioration of the waveform quality, linking or transmission reflection are known. Such linking or transmission reflection that deteriorates the waveform quality is caused under the influence of the inductance-capacitance-resistance (LCR) of a cable connecting a LVDS driver to a LVDS receiver, the input/output (I/O) cell of the LVDS driver, the leadframe or bonding wire of the package, the influence of the parasitic inductance among semiconductor chips of an implemented board or the like, or the influence of the combinations of these multiple conditions.

As linking and transmission reflection are closely related to the transmission rate or slew rates, it is desired that optimal slew rates be selected in order to achieve high-speed transmission with high waveform quality.

Example embodiments of the present invention are described below in detail with reference to the drawings.

[First Embodiment]

An LVDS driver 1 according to the present example embodiment transmits differential signals (LVDS output signals TX1_M to TXn_M and TX1_P to TXn_P) to a plurality of LVDS receivers through a transmission line, and includes a plurality of differential signal generators LV1 to LVn that generate differential signals. In the LVDS driver 1, the slew rates of the differential signals are controlled for each output of differential signal.

<General Outline>

FIG. 1 is a block diagram illustrating an outline of the configuration of a LVDS driver according to the present example embodiment of the present invention. The LVDS driver 1 includes a slew rate adjusting circuit 10, a LVDS circuit 20 provided with the differential signal generators LV1 to LVn (n=1, 2, n), a register 30. The slew rate adjusting circuit 10, the LVDS circuit 20, and the register 30 serve as a slew rate adjusting unit, a differential signal generation unit, and a slew rate control signal setting unit, respectively.

Input signals D1 to Dn are input to the slew rate adjusting circuit 10, and slew rate control signals RE1 to REn are also input to the slew rate adjusting circuit 10 from the register 30. Then, the slew rate adjusting circuit 10 generates adjustment signals, and transmits the generated adjustment signals to the LVDS circuit 20. The details of the adjustment signals are described later.

The LVDS circuit 20 is composed of a plurality of LVDS circuits (i.e., differential signal generators) LV1 to LVn, and the adjustment signals generated by the slew rate adjusting circuit 10 are input to the LVDS circuits LV1 to LVn. The LVDS circuit 20 generates LVDS output signals TX1_M to TXn_M and TX I_P to TXn_P that are the differential signals whose slew rates have been adjusted, and transmits the generated LVDS output signals to a plurality of LVDS receivers.

The slew rate control signals RE1 to REn are set and stored in the register 30, and the register 30 outputs the slew rate control signals RE1 to REn to the slew rate adjusting circuit 10.

The LVDS driver 1 according to the present example embodiment s configured to externally control an LVDS output slew rate using the register 30.

It is desired that the LVDS driver 1 configure the register 30 in an evaluation state before the circuitry is designed and perform evaluation by outputting the slew rate control signals RE1 to REn to the slew rate adjusting circuit 10 after the input signals D1 to Dn are input to the slew rate adjusting circuit 10. Alternatively, it is desired that the LVDS driver 1 configure the register 30 and design the circuitry in view of an evaluation result and the inductance-capacitance-resistance (LCR) of a cable connecting the LVDS driver 1 to a LVDS receiver, the input/output (I/O) cell of the LVDS circuit 20 (LVn), or the leadframe or bonding wire of the package.

The operation of the LVDS driver 1 according to the present example embodiment when n=1 is described below.

Figure 2:
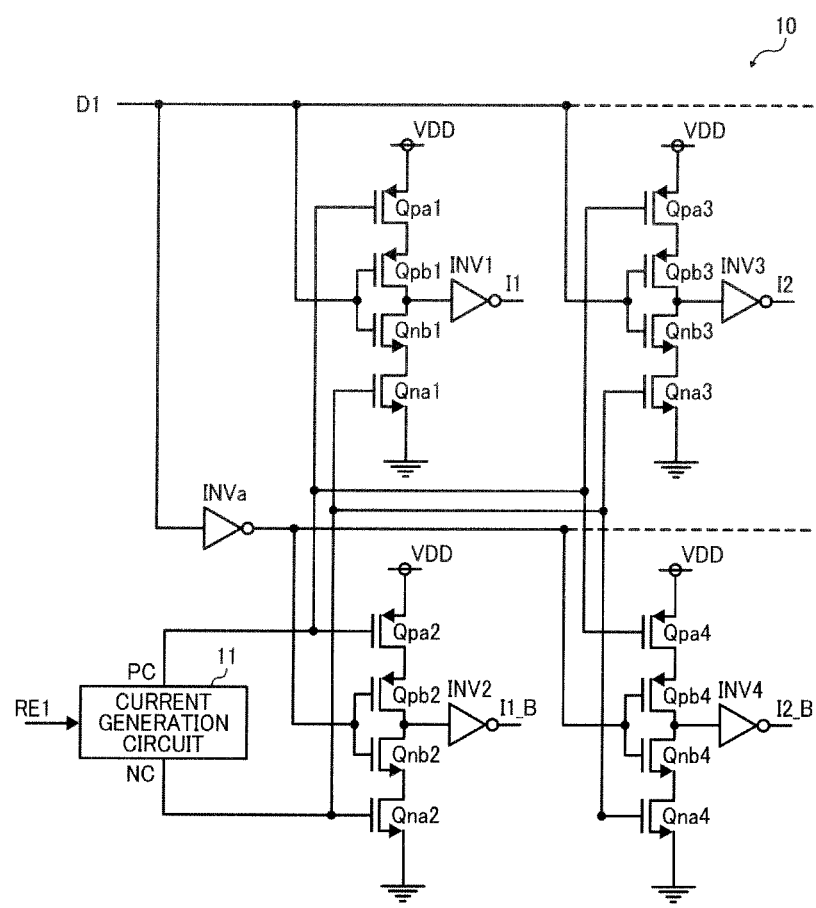
FIG. 2 is a circuit diagram of a slew rate adjusting circuit according to an example embodiment of the present invention.
Figure 3:
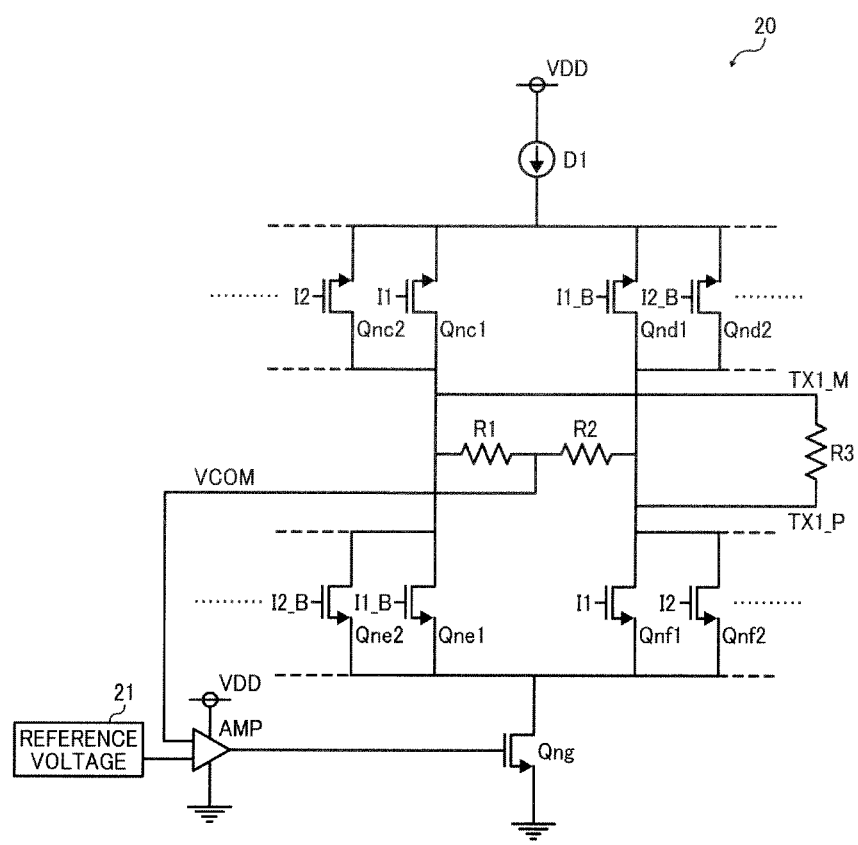
FIG. 3 is a circuit diagram of a LVDS circuit according to an example embodiment of the present invention.

FIG. 2 is a circuit diagram of the slew rate adjusting circuit 10 according to the present example embodiment of the present invention. FIG. 3 is a circuit diagram of the LVDS circuit 20 according to the present example embodiment of the present invention. FIGS. 2 and 3 are circuit diagrams of the parts that are dependent on the condition n=1.

Figure 4:
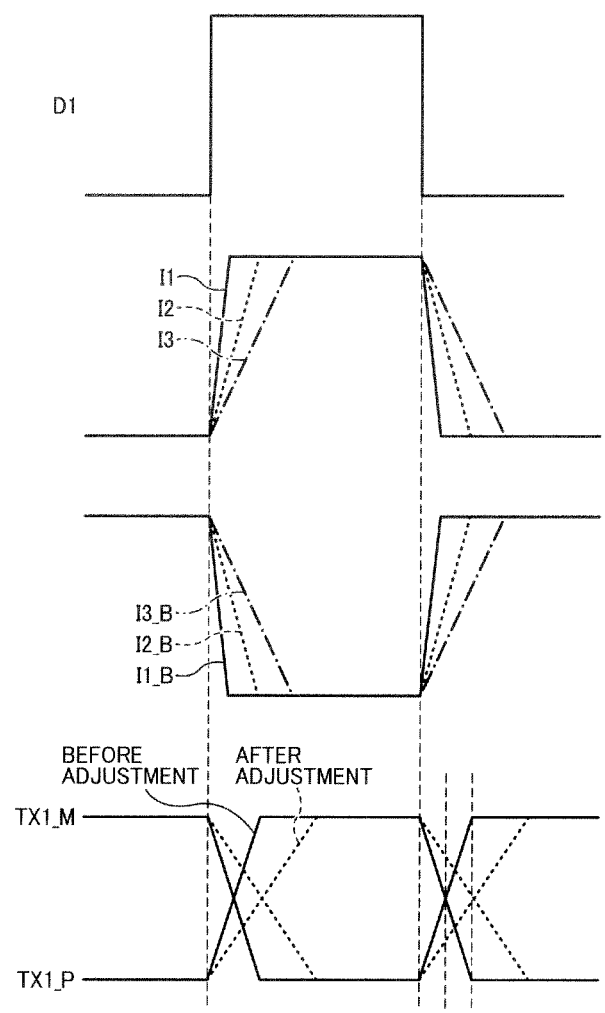
FIG. 4 is a timing chart illustrating the relationship among an input signal, adjustment signals, and LVDS output signals before and after the slew rate is adjusted, according to an example embodiment of the present invention.

FIG. 4 is a timing chart illustrating the relationship among the input signal DI to the slew rate adjusting circuit 10, the adjustment signals I1, I2, and I3 and I1_B, I2_B, and I3_B generated by the slew rate adjusting circuit 10, and the LVDS output signals TX1_M and TX1_P before and after the slew rate is adjusted to slow down, according to the present example embodiment of the present invention.

<Slew Rate Adjusting Circuit>

As illustrated in FIG. 2, the slew rate adjusting circuit 10 includes P-channel metal oxide semiconductor (PMOS) transistors Qpa1 to Qpan, N-channel metal oxide semiconductor (NMOS) transistors Qna1 to Qnan, P-channel metal oxide semiconductor (PMOS) transistors Qpb1 to Qpbn, N-channel metal oxide semiconductor (NMOS) transistors Qnb1 to Qnbn, a current generation circuit 11, an inverter INVa, and inverters INV1 to INVn.

The slew rate adjusting circuit 10 receives the input signal D1, and receives h slew rate control signal RE1 from the register 30.

Each of the sources of the PMOS transistors Qpa1 to Qpan arc connected to a supply voltage VDD, and the drains of the PMOS transistors Qpa1 to Qpan are connected the sources of the PMOS transistors Qpb1 to Qpbn, respectively. Each of the sources of the NMOS transistors Qna1 to Qnan are connected to a ground voltage, and the drains of the NMOS transistors Qna1 to Qnan are connected the sources of the NMOS transistors Qnb1 to Qnbn, respectively. The gates of the PMOS transistors Qpa1 to Qpan are connected to each other and serve as an input terminal, and in a similar manner, the gates of the NMOS transistors Qna1 to Qnan are connected to each other and serve as another input terminal. These two terminals are connected to the current generation circuit I1.

The current generation circuit I1 controls the voltage of the gate signals PC and NC output from the current generation circuit I1 by using the slew rate control signal RE1, and rectifies the electric current flowing between the drain and source of the PMOS transistors Qpa1 to Qpan and NMOS transistors Qna1 to Qnan.

The input signal D1 is input to the gates of the PMOS transistors Qpb1 to Qpbn (n is an odd number) and the NMOS transistors Qnb1 to Qnbn (n is an odd number), Moreover, the input signal D1 is input to the gates of the PMOS transistors Qpb2 to Qpbn (n is an even number) and the NMOS transistors Qnb2 to Qnbn (n is an even number) through the inverter INVa.

The drains of the PMOS transistors Qpb1 to Qpbn and the drains of the NMOS transistors Qnb1 to Qnbn are connected to each other and serve as output terminals. The PMOS transistors Qpb1 to Qpbn are paired with the NMOS transistors Qnb1 to Qnbn, respectively, and each pair serves as an inverter (CMOS inverter). Hereinafter, these inverters are referred to as CMOS inverters CI1 to CIn, respectively.

The outputs from the CMOS inverters CI1 to On go through the inverters INV1 to INVn, respectively, and adjustment signals I1 to In and I1_13 to In_B having the adjusted slew rates are generated and output. Note that the load driving capabilities of the inverters INV1 to INVn are equal to each other.

<LVDS Circuit>

As illustrated in FIG. 3, the LVDS circuit 20 (LV1) includes NMOS transistors Qnc1 to Qncn, Qnd1 to Qndn, Qne1 to Qnen, and Qnf1 to Qnfn, an NMOS transistor Qng, an operational amplifier AMP, a current digital-to-analog converter (DAC) D1, and resistances R1, R2, and R3.

The adjustment signals I1 to In are input to the gates of the NMOS transistors Qnc 1 to Qncn and Qnf1 to Qnfn, respectively. In a similar manner, the adjustment signals I1_B to In_B are input to the gates of the NMOS transistors Qnd1 to Qndn and Qne1 to Qnen, respectively. The operational amplifier AMP generates common-mode voltage Vcom, which is constant voltage, from the reference voltage 21. Note that the reference voltage 21 is the reference voltage generated by a bandgap reference circuit or the like.

The LVDS circuit 20 (LVI) generates LVDS output signals TX1_M and TX1_P that are the differential signals whose slew rates have been adjusted, based on adjustment signals, and transmits the generated LVDS output signals.

<Slew Rate Control>

In the LVDS driver 1 according to the present example embodiment, as illustrated in FIG. 4, the load driving capabilities of the CMOS inverters CI1 to CIn are determined such that the output slew rates among the adjustment signals I1 to In and the slew rates among the adjustment signals I1_B to In_B are different from each other.

In order to achieve such output slew rates as above, the load driving capabilities of the CMOS inverter CI1 to CIn are determined to satisfy the following conditions (1) and (2).

$$I1=I1\_B, I2\_B, \ldots, In=In\_B \quad (1)$$

$$I1 > I2 >, \ldots, > In \quad (2)$$

As the difference in output slew rate are solely determined by the load driving capabilities of the CMOS inverters CI1 to CIn, the wiring between the CMOS inverters CI1 to CIn and the corresponding inverters INVa to INVn are made isometric.

Upon determining the output slew rate as desired based on the load driving capability and parasitic capacitance of the CMOS inverters CI1 to CIn in advance at a designing stage, the LVDS driver 1 can control the current by the slew rate control signal RE1 to control the variations in output slew rate. As the amount of the controlled electric current is greater, the slew rate becomes faster. In other words, as the amount of the controlled electric current is smaller, the slew rate becomes slower.

As illustrated in FIG. 3, the NMOS transistors Qnc1 to Qncn, Qnd1 to Qndn, Qne1 to Qnen, and Qnf1 to Qnfn of the LVDS circuit 20 are driven at differential times by the adjustment signals I1 to In and I1_B to In_B having different slew rates.

As described above, the differences in times at which the NMOS transistors of the LVDS circuit 20 are driven reduce the LVDS output slew rates to some extent, and the LVDS output slew rates can be varied by controlling the electric current.

With the LVDS driver 1 according to the present example embodiment described above, multiple LVDS output slew rates can be controlled using a register. Accordingly, the waveform quality in output signal and the skew among outputs can be improved.

In other words, although variations in characteristic occur among outputs because the output states of the individual LVDS circuits are different from each other, the slew rate can individually be controlled for each output according to the present example embodiment described above, Accordingly, the variations are reduced and the characteristics can he improved, and the waveform quality of all the outputs can also be improved,

[Second Embodiment]

Another example embodiment of an LVDS driver according to the present invention is described below. Note that a configuration similar to that of the first example embodiment may be omitted where appropriate, and differences from the first example embodiment are mainly described.

Figure 5:
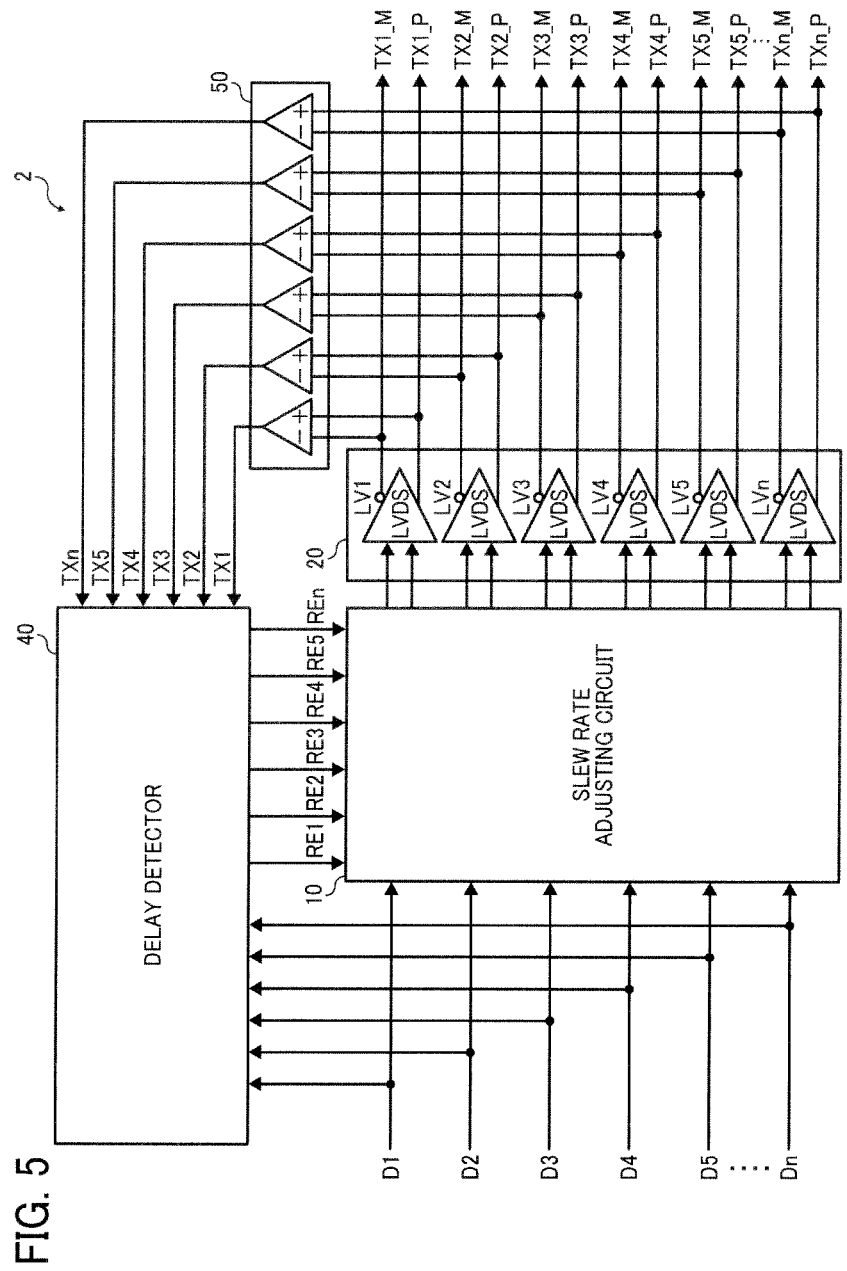
FIG. 5 is a block diagram illustrating an outline of the configuration of a LVDS driver according to a second example embodiment of the present invention.

FIG. 5 is a block diagram illustrating an outline of the configuration of a LVDS driver 2 according to the present example embodiment of the present invention. The LVDS driver 2 includes the slew rate adjusting circuit 10, the LVDS circuit 20, a delay detector 40, and a differential comparator 50. The delay detector 40 serves as a control signal generation unit, and the differential comparator 50 serves as a comparator. The configuration of the slew rate adjusting circuit 10 and the LVDS circuit 20 is equivalent to that of the first example embodiment described above with reference to FIG. 1. The LVDS driver 2 according to the present example embodiment is provided with the delay detector 40 in place of the register 30 that serves as a slew rate control signal setting unit, and further includes the differential comparator 50.

The LVDS driver 2 according to the present example embodiment is configured to compare the delay between an input signal and an output signal to control the delay of the output. More specifically, the LVDS driver 2 uses the differential comparator 50 to compare the input signals D1 to Dn with the LVDS output signals TX1_M to TXn_M and TX1_P to TXn_P, and uses the delay detector 40 to detect delay differences among the signals TX1 to TXn output from the differential comparator 50.

Then, the delay detector 40 generates slew rate control signal RE1 to REn according to the delay differences detected by the delay detector 40, and outputs the generated slew rate control signals RE1 to REn to the slew rate adjusting circuit 10. By so doing, the output slew rates of the LVDS output signals TX1_M to TXn_M and TX1_P to TXn_P are adjusted.

The LVDS driver 2 synchronizes the input signals D1 to Dn and reference clock signals to adjust the output slew rates. Accordingly, the skew among the outputs can be reduced.

Figure 6:
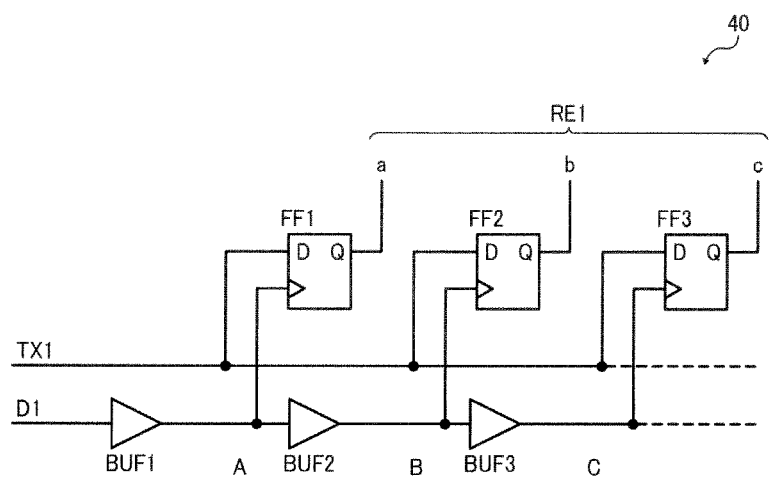
FIG. 6 is a circuit diagram of a delay detector according to an example embodiment of the present invention.

The operation of the LVDS driver 2 according to the present example embodiment when n=1 is described below. FIG. 6 is a circuit diagram of the delay detector 40 according to the present example embodiment of the present invention. FIG. 6 is a circuit diagram of the parts that are dependent on the condition n=1.

Figure 7:
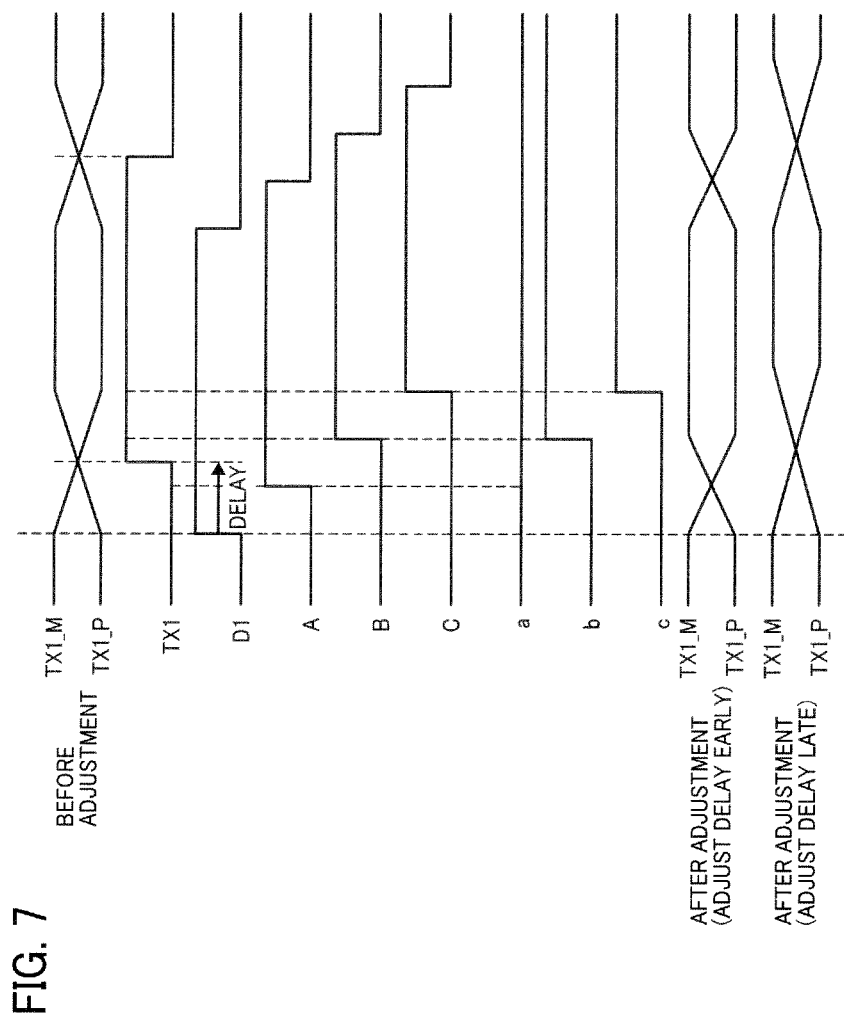
FIG. 7 is a timing chart illustrating the relationship among LVDS output signals before and after adjustment, an output signal from a differential comparator, an input signal, delayed signals, slew rate control signals, according to an example embodiment of the present invention.

FIG. 7 is a timing chart illustrating the relationship among the LVDS output signals TX1_M and TX1_P before adjustment, the output signal from the differential comparator 50, the input signal D1 to the delay detector 40, the delayed signals A, B, and C generated by the delay detector 40, the slew rate control signals RE1 (a, b, and c), the LVDS output signal TX1_M and TX1_P where the delay is adjusted early, and the LVDS output signals TX1_M and TX1_P where the delay is adjusted late, according to the present example embodiment of the present invention.

<Delay Detector>

As illustrated in FIG. 6, the delay detector 40 includes buffers (buffer circuits) BUF1 to BUFn and flip-flops (flip-flop circuits) FF1 to FFn, the input signal D1 and the output signal TX1 from the differential comparator 50 are input to the delay detector 40.

The buffers BUF1 to BUFn delay the input signal D1 to generate the delayed signal A, B, C, . . . , and n. To the flip-flop FF1 to FFn, the output signal TX1 from the differential comparator 50 and the delayed signals A, B, C, . . . , and n delayed by the buffers BUF1 to BUFn are input.

By controlling the delay at buffers (buffer size) and/or the number of the buffers and flip-flops, it becomes possible to configure the resolution and/or range of the detected delay.

In other words, the delay of the delayed signals A, B, C, . . . , and n and the output signal TX1 are detected using the flip-flops FF1 to FFn, and the slew rate control signal RE1=a, b, c, . . . , n having the detection information are output, as illustrated in FIG. 7.

As described above, the resolution or range of the detected delay is made configurable, and the precision of the delay detection of outputs can be improved accordingly.

In order to adjust the skew among outputs, it is desired that the amounts of delay of the output signals TX1 to TXn he increased to approximate the output signal whose amount of delay is the greatest, or that the amounts of delay of the output signals TX1 to TXn be reduced to approximate the output signal whose amount of delay is the smallest. Accordingly, the delays of the multiple outputs are made approximately equal to each other, and the skew among the outputs can be reduced.

With the LVDS driver 2 according to the present example embodiment described above, multiple LVDS output slew rates can be controlled using a delay detector that compares between an input signal and an output signal to determine the amount of delay. Accordingly, it becomes possible to control characteristics automatically even when the characteristics deteriorate due to the actual usage environment, and the waveform quality in output signal and the skew among outputs can be improved.

Note that the embodiments described above are preferred example embodiments of the present invention, and various applications and modifications may be made without departing from the scope of the invention.

Numerous additional modifications and variations are possible in light of the above teachings. It is therefore to be understood that within the scope of the appended claims, the disclosure of the present invention may be practiced otherwise than as specifically described herein. For example, elements and/or features of different illustrative embodiments may be combined with each other and/or substituted for each other within the scope of this disclosure and appended claims.

What is claimed is:

1. An LVDS driver comprising:
    a plurality of differential signal generators each configured to generate a differential signal and transmit the generated differential signal to corresponding one of a plurality of LVDS receivers through a transmission line, wherein a slew rate of the differential signal is controlled for each output of the differential signal;
    a slew rate adjusting unit configured to receive a plurality of input signals and a plurality of slew rate control signals, and generate a plurality of adjustment signals having slew rate information for each of the input signals and the slew rate control signals;
    a different signal generation unit including the differential signal generators each configured to receive the adjustment signals generated by the slew rate adjusting unit and generate the differential signal whose slew rate is adjusted; and
    a slew rate control signal setting unit configured to output the slew rate control signals to the slew rate adjusting unit.

2. The LVDS driver according to claim 1, wherein the slew rate control signal setting unit is a register storing the slew rate control signals therein.

3. The LVDS driver according to claim 1, wherein the slew rate control signal setting unit comprises:
    a comparator configured to compare the differential signals with each other to output signals according to a comparison result; and
    a control signal generation unit configured to receive the output signals from the comparator and the input signals, and detect a delay difference based on the output signals and the delayed input signals to generate the slew rate control signal based on the delay difference.

4. The LVDS driver according to claim 3, wherein
the control signal generation unit includes a buffer circuit and a flip-flop circuit, and
at least one of resolution and range of detected delay is configurable by at least one of a buffer size of the buffer circuit and a number of the buffer circuits and the flip-flop circuits.

5. The LVDS driver according to claim 3, wherein
the control signal generation unit increases amounts of delay of the output signals to approximate the output signal whose amount of delay is greatest, or reduces amounts of delay of the output signals to approximate the output signal whose amount of delay is smallest.

* * * * *